United States Patent [19]

Haferd

[11] 4,388,611

[45] Jun. 14, 1983

[54] ELECTRICITY BILLING METER HAVING UNIQUE A/D CONVERSION SYSTEM

[75] Inventor: James E. Haferd, Columbus, Ohio

[73] Assignee: Scientific Columbus, Inc., Columbus, Ohio

[21] Appl. No.: 256,058

[22] Filed: Apr. 21, 1981

[51] Int. Cl.³ ............................................ H03K 13/02
[52] U.S. Cl. .............................. 340/347 SH; 307/353; 307/354; 328/151; 340/347 AD; 340/347 M; 364/178; 364/179; 364/483; 364/487
[58] Field of Search ............... 364/481, 483, 111, 487, 364/178, 179; 324/142; 340/347 M, 347 AD, 347 NT; 328/151; 307/352-354

[56] References Cited

U.S. PATENT DOCUMENTS 3,530,458 9/1970 Willard et al. ............... 340/347 CC
4,213,134 7/1980 Chen .............................. 328/151 X
4,276,605 6/1981 Okamoto et al. ............... 364/481 X

OTHER PUBLICATIONS

Schmid, Electronic Analog/Digital Conversions, Van Nostrand Reinhold Co., 1970, pp. 274-281.

Primary Examiner—T. J. Sloyan
Attorney, Agent, or Firm—Frank H. Foster

[57] ABSTRACT

Voltage and current signals in a power distribution system are converted to digital data by scaling and sampling the signals and simultaneously comparing all the samples to a digitally generated ramp converted to analog form. When a sample intersects the ramp, the digital number representing the ramp amplitude is loaded into storage without interrupting the ramp generation sequence. A zero cross detector detects a zero crossing for a voltage or current. Sampling is initiated by a programmable, interval timer which is loaded with a selected time interval from a microcomputer and initiates the sampling a selected time interval after the zero cross is detected. The samples are taken during representative, repetitive cycles at angularly spaced positions in a composite cycle to form a group of samples for the composite cycle for each of the signals of the power distribution system. The samples are uniformly spaced in the composite cycle but periodically the sample positions are sequenced through a set of different sample positions.

7 Claims, 8 Drawing Figures

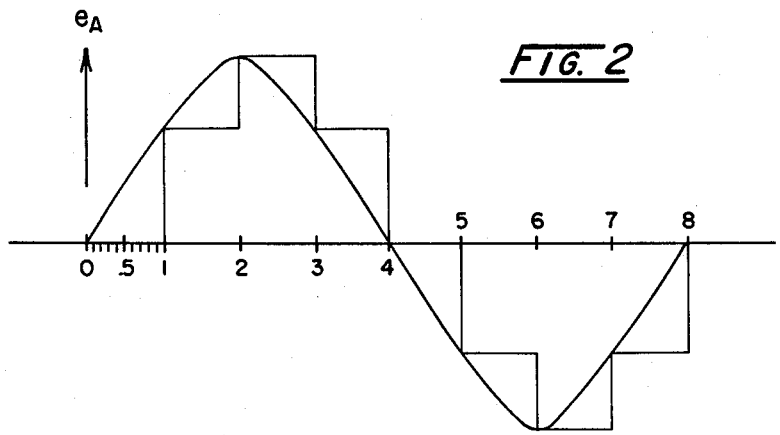

FIG. 2

REAL POWER = $P = \sum_{\phi=a}^{c}\left(\frac{1}{8}\sum_{t=0}^{7} e_{\phi,t}\, i_{\phi,t}\right)$ MAGNITUDE OF REACTIVE POWER = $|VAR|$
$= \sqrt{V^2 A^2 - P^2}$

WHERE:

$V = \sum_{\phi=a}^{c}\sqrt{\frac{1}{8}\sum_{t=0}^{7} u^2_{\phi,t}}$   $A = \sum_{\phi=a}^{c}\sqrt{\frac{1}{8}\sum_{t=0}^{7} i^2_{\phi,t}}$

SIGN OF REACTIVE POWER = SIGN OF $(P_+ - P_-)$

WHERE:

$P_+ = \sum_{\phi=a}^{c}\left(\frac{1}{8}\sum_{t=0}^{7} e_{\phi,t}\, i_{\phi,t+1}\right)$ $P_- = \sum_{\phi=a}^{c}\left(\frac{1}{8}\sum_{t=0}^{7} e_{\phi,t}\, i_{\phi,t-1}\right)$ $\phi$ = DIFFERENT PHASES
eg. A,B,C FOR 3 PHASE POWER FACTOR = $\dfrac{P}{VA}$

FIG. 3

ELECTRICITY BILLING METER HAVING UNIQUE A/D CONVERSION SYSTEM

TECHNICAL FIELD

This invention relates to electricity metering and more particularly relates to a solid state electricity revenue meter which has a unique sampling and A/D conversion system used in the generation of a multiplicity of different functions or quantities which are useful in determining the cost of the electrical energy supplied to a customer.

BACKGROUND ART

In the electrical energy industry the various quantitative measurements which determine customer billing are traditionally obtained from a variety of different devices. Each device is designed and constructed to meter a particular quantity. For example, the historic Ferraris rotating meter is used in a variety of forms to measure real energy or reactive energy (KVAR) and with uniquely designed attachments, to measure related power demand quantities. KW and KVAR transducers when coupled with appropriate integrating means are also used for these purposes. Inherent in the electromechanical structure or electronic circuitry of each such device are the mathematical operations which are necessary to determine the particular quantity.

For example, the rotating Ferraris Kwh meter inherently provides a cumulative total number of output revolutions which is proportional to the product of current, voltage, the cosine of the angle between them and time in hours. Similarly, a KVAR transducer provides an output which is proportional to the product of voltage, current and the sine of the angle between them.

With conventional technology a power company orders and installs those devices or transducers which provide the quantities which are desired. Some manufacturers have combined more than one type of transducer into an aggregation of such devices in a single piece of equipment. U.S. Pat. No. 4,218,737 shows two different transducers combined in a circuit which converts each of their analog outputs to digital form and then processes, stores, communicates and displays the processed data.

Prior art analog/digital conversion techniques include the sampling of a periodic signal by generating a ramp function and continuously comparing the ramp to the sample until there is a transition of the output state of a comparator when the amplitude of the ramp intersects the amplitude of the sample. If the ramp is generated by a digital counter which is periodically incremented and drives a D/A converter, then the accumulated count of the counter is a digital measurement of the amplitude of the sample.

However, if these prior art techniques were applied to the sampling of two or three voltage and two or three current signals from a three phase electrical energy distribution system, a total of four to six of these conventional analog/digital converter circuits would be required. Not only would this require excessive duplication of circuitry, but there would be significant problems in both the synchronization of the circuits so that the samples could be taken simultaneously or at accurately selected times and in the standardization of the gain of the circuitry so that all samples would be accurate at all times.

Another difficult problem with prior art analog to digital converters would be the microprocessor time that would be required for control of four to six such converters. The long time requirement for the sampling would also result in inaccuracies due to signal changes which would occur between samples.

Conventional sampling techniques also call for a selected number of samples taken at specific intervals across a cycle. For example, samples might be taken at 45° intervals. However, the presence of higher order harmonics and transient conditions allow some inaccuracies to occur with such conventional sampling technique because of the unsampled intervals between the regularly spaced sample positions.

BRIEF DISCLOSURE OF THE INVENTION

This invention has no transducer or device which directly generates any of the functions or quantities which are used for billing purposes. Instead, the present invention provides electronic solid state circuitry which samples the basic analog quantities of instantaneous current and instantaneous voltage as they appear in the power distribution system at some interconnection terminal, such as between a power line and the energy consuming equipment of the customer. Those current and voltage samples are converted directly to digital form. Data signals representing the voltage and the current samples are the processed by a data processing unit to provide the desired quantities.

The analog to digital converter of the present invention utilizes a digital counter which is incremented by a clock and drives a digital to analog converter to generate a single ramp. A plurality of comparators each have one input connected to a different one of the input voltage and current samples and the other input connected to the one ramp. The comparators simultaneously compare the one ramp to all of the samples. A logic gate detects a comparator transition upon intersection of the ramp with a sample and in response to each intersection, the count of the counter and the status of the comparators is stored in memory to represent respectively the amplitude of the sample and the particular sample having that amplitude.

By using a single circuit with a single ramp, all samples which are taken at the same time, are converted to digital form in less time with less circuitry. There is no need for the microcomputer to control six ramp generators or to store the data from six different ramp generators. All six digital sample amplitudes may be generated and stored in one cycle of the ramp. There is only one ramp and it is smoothly and continuously generated and therefore or better accuracy.

Additionally, in accordance with the present invention the position of the samples is varied. The shifting is accomplished in a sequence which minimizes error. The sampling technique gives a more accurate digital representation of harmonics and transient conditions over a shorter sampling or measurement time period. Error is further reduced by providing reference signals which are converted from analog to digital form by the same A/D converter. The microcomputer continuously monitors the value of these reference signals and utilizes the quantity of any changes in them to derive a correction factor to compensate for any gain changes resulting from temperature or time induced drift.

BRIEF DESCRIPTION OF THE DRAWINGS

FIG. 2 is an oscillogram illustrating the sampling technique used in the operation of the preferred embodiment.

FIG. 3 is a table of equations illustrating the data processing which is used to convert the voltage and current samples to some of the most commonly used metering quantities.

Figure 1:
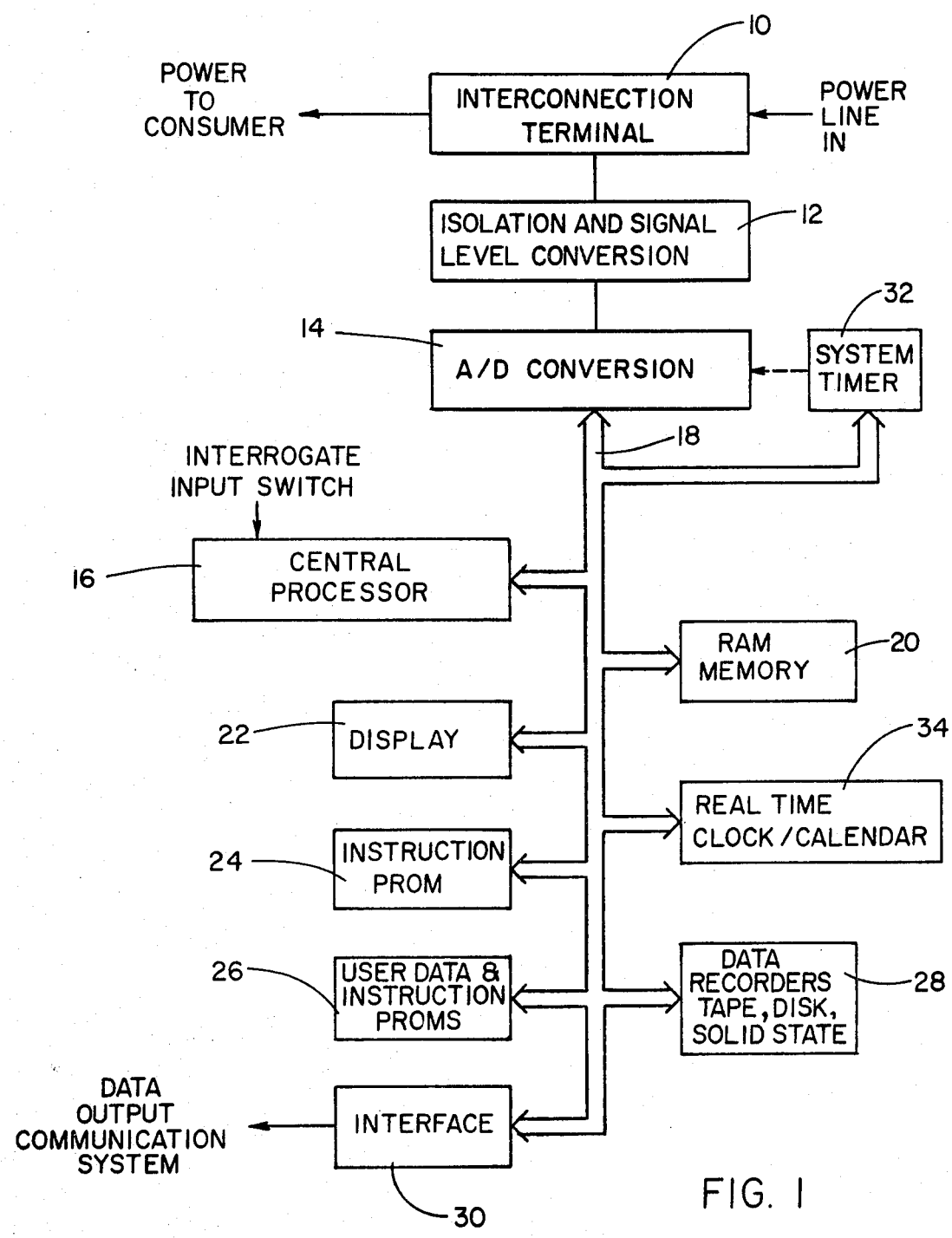
FIG. 1 is a block diagram illustrating an Electricity Billing Meter System embodying the present invention.

In describing the preferred embodiment of the invention which is illustrated in the drawings, specific terminology will be resorted to for the sake of clarity. However, it is not intended that the invention be limited to the specific terms so selected and it is to be understood that each specific term includes all technical equivalents which operate in a similar manner to accomplish a similar purpose. For example, the word connected or terms similar thereto are often used. They are not limited to direct connection but include connection through other circuit elements where such connection is recognized as being equivalent by those skilled in the art.

DETAILED DESCRIPTION OF THE BEST MODE

Referring to FIG. 1, electrical power from a distribution system is provided to an interconnection terminal 10 and from the interconnection terminal 10 is supplied to the energy consuming equipment of the customer. While interconnection terminal 10 may be either custom designed or a conventional type, usually it is either an S-type mounting for socket connection to a Ferraris-type meter or an A-type mounting for direct connection of the line and the load conductors. Generalizing, however, the interconnection terminal may also represent an interchange tie point at the junction of the power lines of two distribution networks.

An isolation and signal level conversion means 12 has its input connected to the interconnection terminal 10 and provides at its output a plurality of analog signals which are proportional to the instantaneous voltage and current of the phases of the power line. Preferably, these are conventional transformers which provide isolation and reduce the voltage and current signals to a level which is compatible with solid state circuitry.

The present invention will operate with single and multi-phase power distribution systems and can utilize the simplifications allowed by Blondel's theorem when applicable. In a single phase system there will be one or two current transformers and one or two voltage transformers. However, for conventional three-phase systems, the isolation and signal level conversion means 12 will consist of two or three voltage stepdown transformers and two or three current transformers. Therefore, in the three-phase system the output of the isolation and signal level conversion means 12 will consist of two or three output current signals which are proportional to the instantaneous currents of the power distribution system at the interconnection terminal 10 and two or three voltage signals which are proportional to the three voltages of the three-phase system at the interconnection terminal 10.

The output of the isolation and signal level conversion means 12 is applied to an analog to digital converter or A/D conversion means 14. The analog to digital conversion means 14 is controlled by a central processing unit 16. The A/D conversion means 14 converts the analog signals which are applied to its input, such as the three instantaneous current and three instantaneous voltage signals for a three-phase system, to digital data signals representing instantaneous values of the voltages and of the currents for the three phases.

Thus, for example, the output of the A/D conversion means 14 for a three phase system might consist of three current and three voltage data words which are applied to the data portion of a data, address and control bus 18 in accordance with conventional data processing design principles.

The central processing unit 16 is also connected through the bus 18 to a RAM memory 20, a display 22, a programmable read-only memory or PROM 24 and a second PROM 26.

Two PROMS 24 and 26 are used so that the PROM 24 may be permanently installed and contains instructions and data which are common to usage of the multifunction revenue meter by all users. The PROM 26, however, is replaceable and contains instructions and data for a particular installation.

The bus 18 is also connected to data recording mechanisms such as tapes, disks, and solid state memories which may be referred to as a data recorder 28 and to conventional interfacing circuitry 30 to permit transmission of the data through a communication system.

A system timer 32 is connected to the bus 18 and is connected to the A/D conversion means 14. A real time calender/clock 34 is also connected to the bus 18 and is needed for computing the time based electricity metering quantities.

The manner of connecting a central processor through a bus to associated RAM and ROM memories, output devices and the other described elements is well known to those skilled in the art and therefore is not disclosed in further detail.

Figure 4:
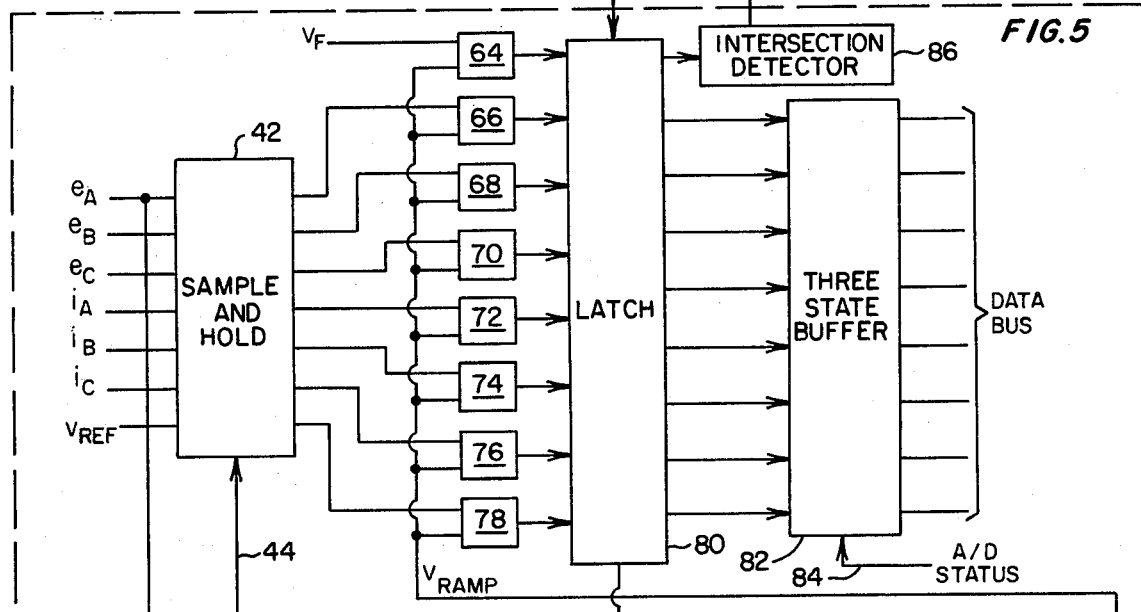
FIG. 4 is a block diagram illustrating the preferred analog to digital converter of the present invention.

FIG. 4 is a block diagram illustrating an analog to digital converter embodying the present invention. The six analog voltage and current signals from the isolation and signal level conversion means 12 are designated $e_a$, $e_b$, $e_c$, $i_a$, $i_b$, and $i_c$. A pair of precision, constant reference voltages $V_{ref}$ and $V_f$ are generated by a voltage reference source 40.

As illustrated in FIG. 4, $V_{ref}$ and the six outputs from the isolation and signal level conversion means 12 are applied to a sample and hold circuit 42. The sample and hold circuit 42 is essentially a plurality of semiconductor analog switches each connected to a different one of a plurality of capacitors and switched simultaneously by a control input 44. With the switches closed, the capacitors charge and discharge with the input signals so that the capacitor voltage is always equal to the signal voltage. When the switches are opened, the capacitors are disconnected from the input signals so that the voltage level on the capacitors when the switches are opened becomes a constant signal forming a sample taken at the time the switches were opened. Thus, the output of the sample and hold circuit 42 provides a plurality of constant signals which are subsequently converted to digital form.

A twelve state binary counter 46 and a digital to analog converter 58 are used for generating a ramp function. this ramp counter 46 has an input 48 which is connected through a NOR gate 50 to a clock signal which is applied at its controllable clock input 52 for periodically stepping the ramp counter 46 through its binary count. The NOR gate 50 operates to stop the count when it is completed, that is when the thirteenth bit at pin one goes to a 1 state. The status of the ramp counter 46 is output through a three state buffer to the data bus upon command from the microcomputer applied at control input 56.

The output of the ramp counter 46 is also applied to a digital to analog converter 58. As the ramp counter 46 increments through its counting sequence, its output is continuously converted to an anlog signal at the output 60 of the D/A converter 58. This ramp output, applied through an amplifier 62, provides a ramp signal $V_{ramp}$ to be compared to the previously taken and stored samples stored by the sample and hold circuitry.

The ramp signal $V_{ramp}$ is applied to each of a plurality of comparators 64 through 78. The other inputs to the comparators 66 through 78 are connected to the output of the sample and hold circuitry for receipt of the constant signal samples. The other input of the comparator 64 is the constant reference source $V_f$ generated by the voltage reference source 40.

The voltage reference source 40 is preferably designed so that $V_{ref}$ is a constant voltage equal to one-half of the peak amplitude of $V_{ramp}$. The average voltage for all input analog signals is equal to $V_{ref}$ and all inputs are scaled to insure that the input voltage peaks do not exceed the peak amplitude of $V_{ramp}$ or go below the minimum ramp voltage under normal operating conditions. The peak ramp amplitude must be slightly more than $V_f$ in order to cause a transition of comparator 64. Therefore, $V_f$ is more than twice the maximum expected peak signal amplitude but less than the ramp peak.

Because $V_{ref}$ and $V_f$ are constant DC voltage levels, it is not required that they be sampled by the sample and hold circuit. However, $V_{ref}$ is applied through the sample and hold circuit 42 so that it is sampled with the analog input signals so that the microcomputer can detect and compensate for any changes in the reference voltage. In addition the second and separate constant voltage $V_f$ is sampled so that the microcomputer can detect and correct for any changes in the gain of $V_{ramp}$.

The outputs of the comparators 64 through 78 are applied to a latch 80 and through latch 80 to a three state buffer 82. The three state buffer 82 applies the latch output states to the data bus upon command from the microcomputer at a control input 84. Together, the latch 80 and three state buffer 82 provide part of a data transfer and storage means connected to the output of the comparators for storing a data byte representing the status of the comparators.

An intersection detector 86 is connected to the latch 80 for detecting the transition of a comparator which occurs when the ramp level passes from less than to more than the sample level, thus causing a transition of a comparator.

Detection of a transition by the intersection detector 86 initiates a sequence of events which causes the state of the ramp counter 46 and the state of the comparators 64 through 78 to be stored in memory. The state of the ramp counter 46 represents the digital value of the amplitude of the sample which was just intersected by the ramp. The state of the comparators represents the comparator which just changed state and therefore by comparison with the previously stored state represents the particular sample having the magnitude which is represented by the ramp counter state.

The storage of the ramp counter status and the comparator status is initiated by a change of state at the output 88 of the intersection detector 86. Preferably, the storage is accomplished through a sequence of direct memory access operations by the microcomputer.

First the status of the ramp counter 46 is transferred to memory through the data bus by command to the binary counter buffer 54 at control input 56. Next the comparator status is transferred to memory through the data bus by command to the comparator latch buffer 82 at control input 84. The sequence is completed before the ramp counter is incremented so that the data transferred to memory is the status of the ramp counter 46 and comparators 64 immediately following the change of state of the intersection detector 86.

For this purpose a direct memory access controller 90 is provided which is clocked by the system clock 32.

Upon initiation of its timing sequence by the output 88 from the intersection detector 86, the direct memory access controller 90 sequentially applies "counter status" and "A/D status" signals to the three state buffer 54 and the three state buffer 82 causing them to apply their respective data in sequence on the data bus.

The system clock 32 is also applied through a divider 92 to the input 52 of the NOR gate 50 to provide the clock pulses which step the ramp counter 46. Thus, the frequency at which the ramp counter is incremented is ⅓ the frequency of the clock applied to the direct memory access controller 90. This is done because in the particular circuitry used, the data for the state of the ramp counter 46 and the comparators must be put on the data bus in three different steps. With divider 92, these three steps may be performed to store all the necessary data before the ramp counter is again incremented. The ramp counter is therefore continuously stepped at the same frequency uniformly throughout the entire ramp cycle and the ramp generation cycle need not be interupted for the storing of data when a comparator transition occurs.

A zero cross detector circuit 94 has an input connected to one output of the isolation and signal level conversion means 12. It operates to detect a selected phase angle of one of the time varying analog signals. As illustrated, it compares the AC voltage signal $e_a$ of phase A to the $V_{ref}$ signal which is at the average or center of the AC input signal. The detector 94 output is a pulse which occurs each time the AC voltage signal crosses its average value $V_{ref}$. The detector pulse is used as the time reference for location in time of each sample. The detector output starts the programmable timer 96. The micro computer has previously initialized the timer with a mode value and a count value prior to allowing a zero crossing detector output by removing the zero crossing inhibit 99.

The output of the zero cross detector 94 is ANDed with a "CPU ready" control signal from the microcomputer and input to a programmable interval timer 96. The programmable timer 96 has data inputs connected to the data bus and inputs connected to the system clock and the microprocessor for being controlled by the microprocessor. Its output 98 is connected to the ramp counter 46 and the sample and hold circuit 42 for initiating both the taking of the sample and the stepping of the ramp counter 46. It is also connected to the latch 80 for clearing that latch.

The microprocessor may be programmed by conventional techniques to compute each sample position. The selected position may be described in the form of a time delay from the receipt of the zero cross signal from the zero cross detector 94 until the time of the sample. The microprocessor computes the sample position time and loads the time into the programmable timer 96. Upon detection of the particular selected phase angle by the zero cross detector 94, if the CPU is ready, the programmed time delay is begun. After the programmable timer 96 has counted through its programmed time interval, its output 98 switches state to initiate the taking of the sample and the stepping of the ramp counter 46.

If eight samples of a 60 Hz signal are to be taken, the first programmed time delay may be 0, the second may be 2.083 milliseconds and the remaining samples integral multiples of the 2.083 msec until the eight samples are taken. However, in accordance with the present invention, the position of the first sample of each eight-sample group may be varied as subsequently described. When this is done the group of eight samples are preferably still uniformly spaced. Thus, samples subsequent to the first are still spaced after the first by integral multiples of 2.083 milliseconds.

Figure 5:
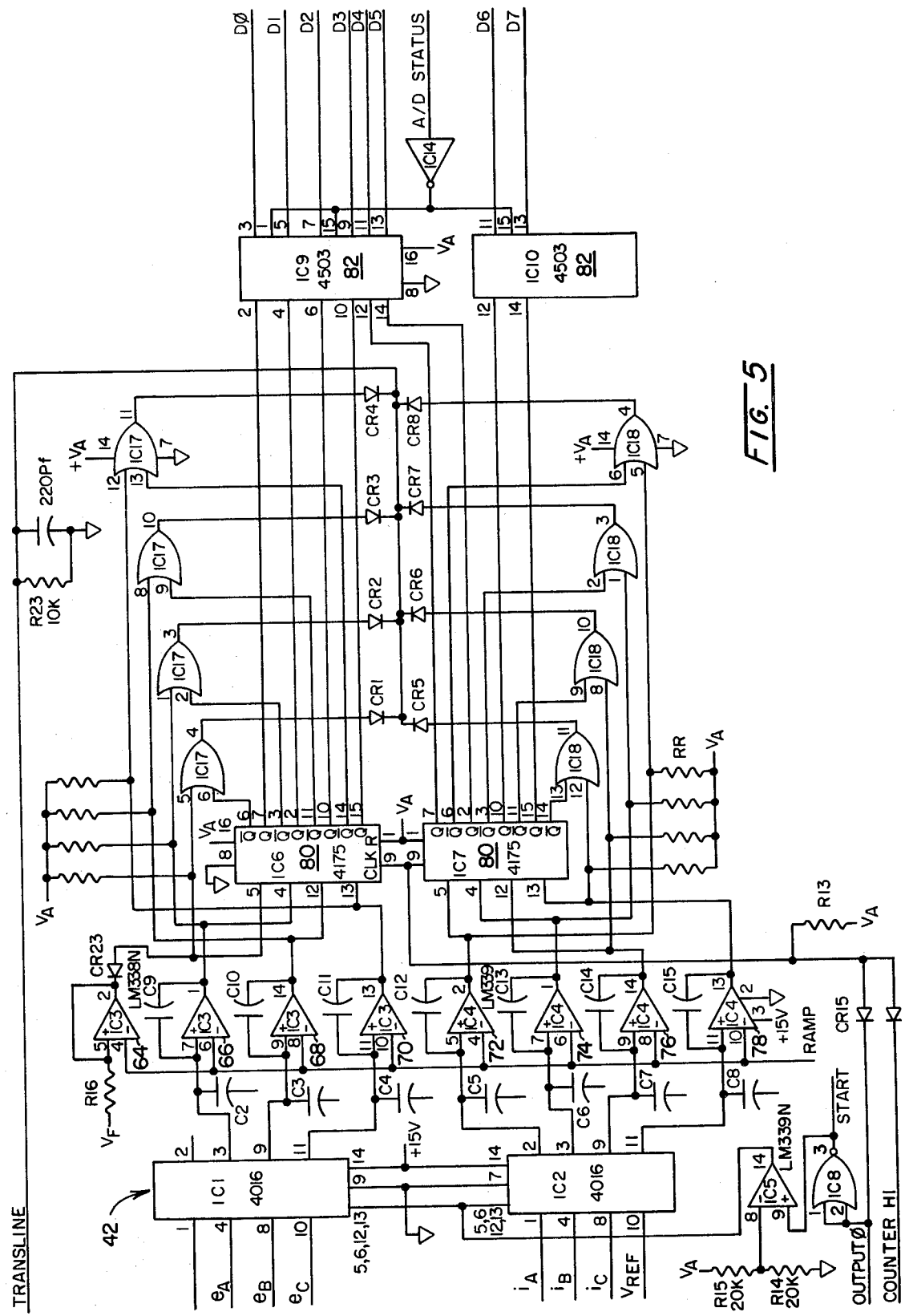
FIGS. 5, 6, 7 and 8 are detailed schematic diagrams of the preferred embodiment of the present invention illustrated in FIG. 4.

The detailed circuitry for the sample and hold circuit 42, comparators 64 through 78, the latch 80, three state buffer 84 and associated circuitry is illustrated in detail in FIG. 5.

Referring to FIG. 5, the sample and hold circuit 42 consists of a pair of analog switches IC1 and IC2 connected to storage capacitors C2 through C8.

The latch 80 of FIG. 4 consists of IC6 and IC7 of FIG. 5. The intersection detector 86 consists of the eight gates IC17 and IC18 and diodes CR1 through CR8. Each of the eight gates has one of its inputs connected to a comparator output and the other of its inputs connected to the inverted output of the latch IC6 or IC7. Thus, whenever a comparator switches states, the output state of one of the IC17 or IC18 gates will switch states. The outputs of these gates IC17 and IC18 are ORed through diodes CR1 through CR8 to provide an output signal, called "transline", which signals that an intersection of the ramp with a sample level has occurred.

IC9 and IC10 of FIG. 5 provide the three state buffer 82 of FIG. 4. The "A/D status" signal from the programmable timer 96 is applied through inverter IC14 to buffers IC9 and IC10 to put their data on the data bus which is designated D0 through D7.

The output signal, labelled "output 0", from the programmable timer 96 is applied through NOR gate IC8 as the start signal for the ramp counter 46. It is also applied through IC5 as the control signal for the analog switches of IC1 and IC2. The "output 0" signal is also applied to the latches IC6 and IC7 to preset them to their initial state. Their initial state will be all the Q inputs high and $\overline{Q}$ inputs low. These states necessarily result from latching the outputs of the comparators into the latches at the time the ramp begins and therefore is less than all samples.

The "counter hi" signal is also applied to the clock input terminal of the latches IC6 and IC7. The "counter hi" signal is discussed below, but operates to latch into the latches IC6 and IC7 the current state of the outputs of the comparators at the beginning of the three step direct memory access cycle in which the counter status and comparator status is directly stored in memory.

Figure 8:
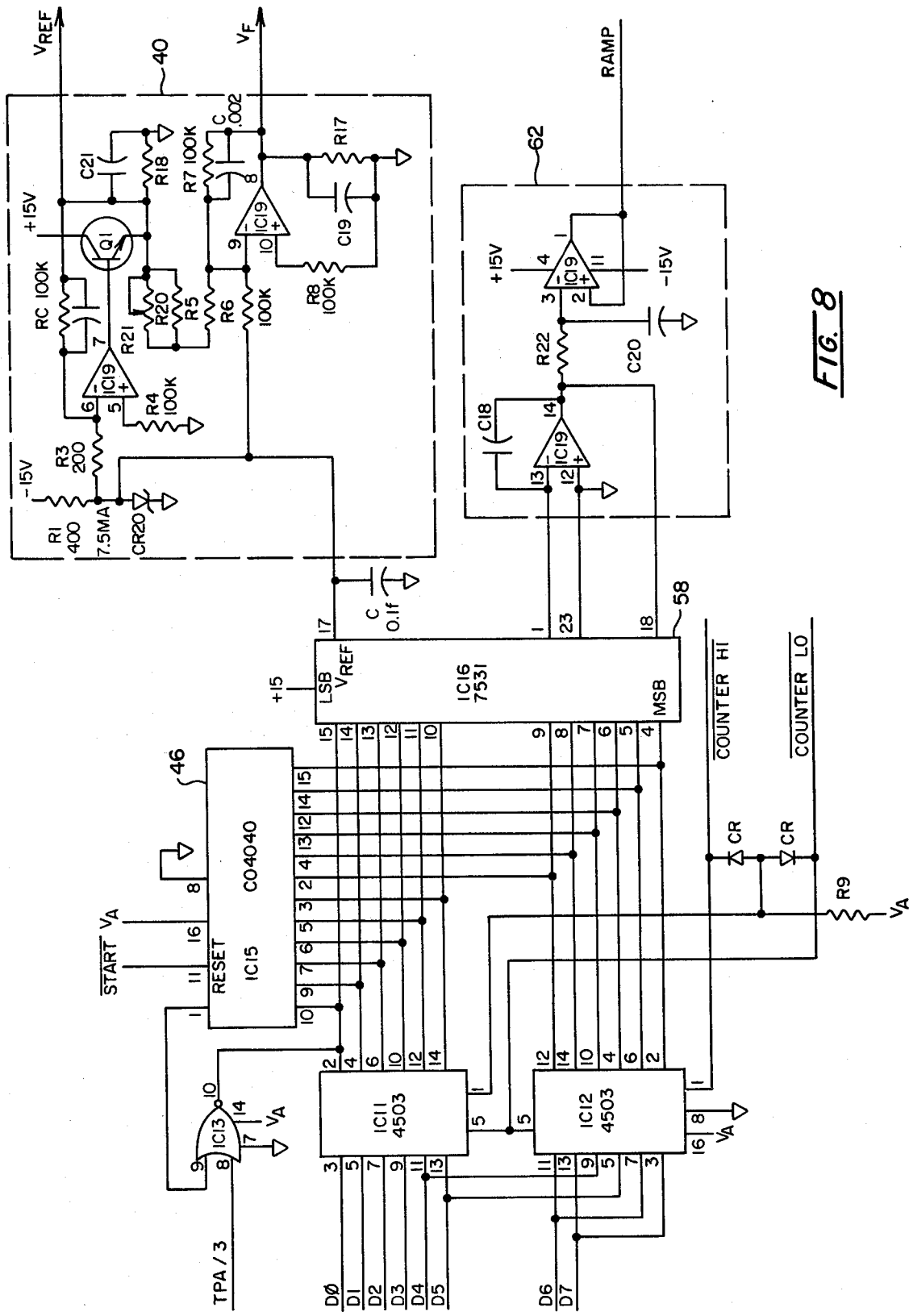

FIG. 8 illustrates the ramp counter 46, voltage reference source 40 and associated circuitry. Referring to FIG. 8, the three state buffer identified as 54 in FIG. 4 is preferably a pair of three state octal buffers IC11 and IC12. Because the circuit uses an octal data bus and the preferred counter has a 12 bit output, the 12 bits of counter data must be stored in memory through the data bus in two steps. It is therefore necessary that the direct memory access sequence timer 90, which is described below with reference to FIG. 6, generates two separate outputs signals for storing the counter status. These two signals are labelled "counter hi" and "counter lo", one for placing the four higher order bits on the data bus and the other for placing the eight lower order bits on the data bus.

IC13 is a NOR gate which gates the clock pulses to the ramp counter 46 until pin 1 of IC15 switches state. Pin 1 switches state when the ramp counter 46 has incremented 2048 times to complete its generation of the entire ramp. After this count is reached, the switching of pin 1 prevents further clock signals from being applied to the counter 46. The absolute value of $-V_{ref}$ which is applied to pin 17 of IC16 is equal to twice the absolute value of $V_{ref}$.

Figure 7:
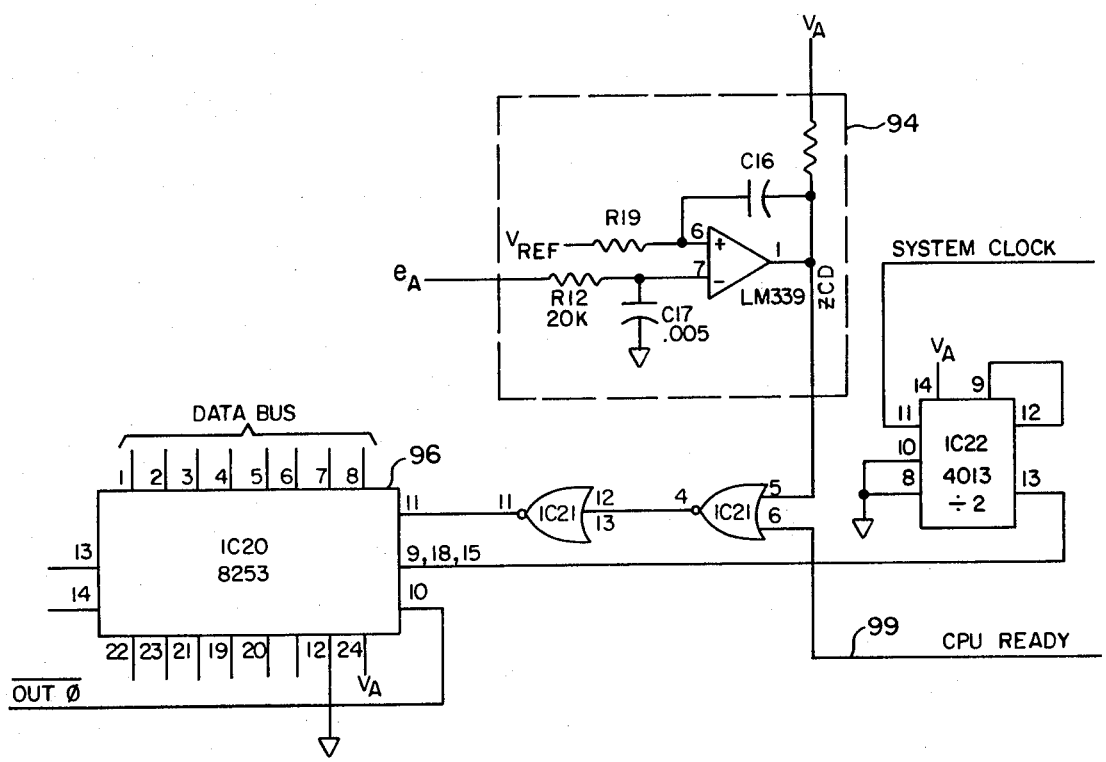

FIG. 7 illustrates the programmable control timer circuit for the A/D conversion. Referring to FIG. 7 the programmable timer IC20 is connected to the data bus and through two NOR gates IC21 to the microprocessor control line which provides a signal labelled "CPU Ready". The "CPU Ready" signal is effectively ANDed with the output of the zero cross detector 94 so that the zero crossing will initiate the timing sequence of the control timer 96 when the CPU is ready. IC22 is a divider which divides the clock pulses by two for operation of the timer 96.

Figure 6:
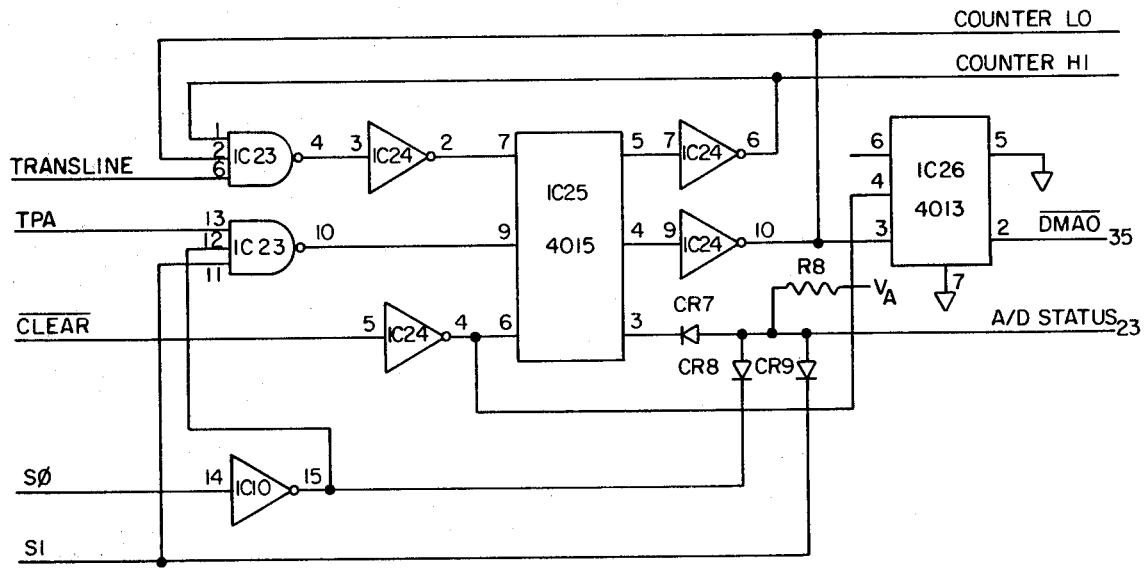

FIG. 6 illustrates in detail the direct memory access data sequence timer 90 of FIG. 4. Referring to FIG. 6 the sequence timer generates in sequence first a "counter hi" signal for putting the ramp counter data of buffer IC12 on the data bus and then generates a "counter lo" signal for putting the data of the other digits of the counter on the data bus through IC11. It then provides an "A/D status" output signal for switching the buffers IC6 and IC7 of FIG. 5 to place the comparator output status data on the bus for storage in memory. Thus, what is referred to as "counter status" signal in FIG. 4 is in the preferred embodiment actually two signals, one "counter hi" and one "counter lo".

Output DMAO is the direct memory access request signal to the micro computer. Inputs TPA, S∅ and S1 provide control inputs from the micro computer for control of the sequencing of the direct memory access controller. Each TPA pulse clocks IC25 when, but only when, S∅ and S1 represent a binary 2 i.e., when S1 represents a 1 and S∅ a 0.

OPERATION OF PREFERRED EMBODIMENT

The sampling theory is first discussed and then the operation of the preferred embodiment using that theory is described.

Because of the time required for a sampling operation, only one sample is taken of each of the eight signals in any one cycle of the reference phase $e_a$. During subsequent cycles, samples are taken at different angular positions. For example in one cycle a sample, labelled 1, may be taken at 45° and during a later cycle a sample may be taken at 90° and labelled 2. The remaining samples are taken during subsequent cycles. These samples, however, are taken in sufficiently close time proximity that they may be considered together in a composite cycle which is illustrated in FIG. 2. It should be understood that all samples could, within the spirit of the present invention, be taken in a single cycle if sufficiently fast semiconductor circuitry were used.

There are eight different signals which are simultaneously sampled in the preferred embodiment. These are the three voltage signals $e_a$, $e_b$ and $e_c$, the three current signals $i_a$, $i_b$ and $i_c$ and the reference signals $V_{ref}$ and $V_f$. Samples of each of these signals are simultaneously taken although FIG. 2 only shows the sample of $e_a$. The timing of the sample for each signal in the preferred embodiment is accomplished with reference to the voltage signal of one phase, the $e_a$ signal. FIG. 2 therefore represents a composite cycle of $e_a$ only. The other time varying inputs would appear similarly except for phase shifts with respect to $e_a$.

In the preferred embodiment it is desired to sample each composite cycle at eight uniformly spaced sample positions across the composite cycle. It should be understood, however, that other numbers of samples and sample spacings are possible. These eight sample positions are labelled 1 through 8.

The obtain the eight samples of FIG. 2 for each of the sampled signals, with the preferred embodiment the microcomputer first calculates the time delay required to position the first sample at position 1, for example at 45° from the zero crossover. That would be a real time delay of 2.083 msec. The first samples for all eight input signals are simultaneously taken at position 1 of $e_a$. The first sample for each signal is then converted to digital form and stored in memory as described below.

The microcomputer then computes the time delay needed to take samples at position 2 of $e_a$ and similarly those samples are taken for all signals being sampled and then converted to digital form and stored in memory. This procedure is repeated until all eight samples for each of the signals being sampled have been taken at the eight different sample positions and then converted to digital form and stored in memory.

This results in a group of eight samples for each input signal and, in the preferred embodiment, a total of 64 samples. These samples are then operated upon in accordance with known sampling and electricity metering equations like the equations of FIG. 3 to calculate the variety of electricity metering quantities which are desired. The results of these calculations are stored in memory.

The above process is then repeated to store in memory another eight uniformly spaced samples for each of the signals being sampled. However, the next set of eight samples are preferably taken at different sample positions on $e_a$ than the first set.

The space between each of the initial eight samples may be subdivided into a subset of ten sample positions. These subset sample positions may be labelled 1 through 10 in order. The second set of eight samples for each sampled signal may be taken at sample positions which are intermediate the first group of eight sample positions. For example, if the first group of samples illustrated in FIG. 2 is taken at subset position 1, the next group of eight samples of the composite cycle may be taken at intermediate positions such as subset position 6. Subsequent groups of eight samples are taken at different subset sample positions.

In the preferred embodiment, it is desired to maintain a uniform spacing between the eight samples. The microcomputer first computes the subset sample position of the first sample of each eight-sample group. It then computes later sample positions for the group of eight samples of a composite cycle by adding the same sample spacing or time delay used for all other groups of eight samples. The third and subsequent groups of eight samples of each of the eight signals are similarly taken at different subset positions until eight samples have been taken of each signal for each of the ten subset positions. The procedure is then repeated.

In order to most quickly approximate the actual analog waveform with samples in the shortest time, it is desirable to take the subset samples in a particular sequence. The sequence is chosen so that each subset sample position is spaced from the previous sample subset position by a distance of approximately ½ of the uniform sample spacing. In this way each sample is taken nearly midway between the previous samples. In particular we prefer that the 10 subset sample positions be utilized in the sequence 1, 6, 2, 7, 3, 8, 4, 9, 5, 10.

As is understood in the art, sampling techniques provides only an approximation of the actual analog signal. Errors are always present. However, selecting the sample positions in the manner described above minimizes that error.

A mathematical analysis of a pure sinusoid and of samples of it can provide the quantitative values of this error. The sample positions are chosen so that, to the extent possible, each group of eight samples has an error which tends to offset the error of the previous group of samples. If the subset sample positions were taken in order, cumulative error would be first in one direction and then in the other. Although the cumulative error after all 10 subset sample positions were used would be the same whether the samples are taken in order or in accordance with the method of the present invention, the error varies at a higher frequency with the present invention and does not reach a peak value as great as it would if the subset sample positions were takn in order. Since the error varies at a higher frequency the sampling is more accurate over a shorter time interval.

Therefore, in summary, for each sampled signal, eight samples which are uniformly spaced throughout a composite cycle are taken, each sample being converted to digital form and then stored. Calculations are then made for each group of eight samples for each input signal and the results are stored in memory. This is then repeated for 10 different subset sample positions with similar calculations being performed for each of the subset positions. The resulting calculations for each group of eight samples are either accumulated for time integrated electricity metering functions or stored in memory for use in later billing calculations.

For example, real power may be computed for the time interval over which the sample is taken. It is computed for each phase by summing the products of each voltage sample and its simultaneously taken current sample for all of the eight sample positions then dividing that sum by the number of samples, such as eight. This is done for each phase and then the three results are summed. The computed real power is then stored in memory along with data representing the time at which the quantity was determined. For the next group of eight samples the above computations are made and the result is summed with the previously computed power. In this way the power calculations are accumulated to provide total energy. The same computing techniques may be applied to the other conventional revenue metering quantities for which there are standard definitions and algebraic statements well known to those skilled in the art.

Similarly, the mathematical statements defining other quantities and algorithms based on rate structure may be implemented by the processor and its associated memories and the date may be displayed and/or communicated as desired.

Referring now to the figures the circuit operation begins with the calculation of the time delay to the first sample position being loaded into the programmable control timer 96. When the computer is ready to begin the sampling operation, it signals by outputting a "CPU ready" signal through a suitable control line. The first zero crossing which is subsequently detected by the zero cross detector 94 then initiates the time delay of the programmable timer 96.

After the programmable timer 96 has timed through its programmed time interval, its output 98 will shift levels to apply an "output 0" signal to the ramp counter 46, the latch 80 and the sample and hold circuit 42. This "output 0" signal switches the sample and hold circuit 42 to simultaneously sample the plurality of time varying analog signals which are applied to its input. It also resets the latch 80 and initiates the stepping of the ramp counter 46. The ramp counter 46 begins generating a $V_{ramp}$ signal through the D/A converter 58. The voltage reference source 40 continuously applies the reference signal $V_{ref}$ to the D/A converter 58 for generating the ramp. The ramp is applied to the comparators for continuously comparing the amplitude of the ramp to the amplitude of each of the plurality of constant signals stored by the sample and hold circuit 42.

When the ramp amplitude intersects the amplitude of the sample having the smallest amplitude, the intersection is detected by the intersection detector 86. This outputs a "transline" signal at its output 88 to initiate the three step sequence of the DMA timer 90.

In sequence the DMA timer 90 applies the "counter hi" and then the "counter lo" signals to the latch 80 and then applies the "A/D status" signal to the three state buffer 82. In this manner the data representing the ramp counter count and the comparator status is sequentially placed on the data bus for storing in memory in accordance with conventional computer operating principles. As described above these three data storing steps occur before the next increment of the ramp counter 46.

The next ramp counter increment then occurs and continues occurring until the next smallest sample is intersected by the ramp signal. The steps are repeated continuously until all samples have been intersected and the count of the ramp counter and the comparator status for each sample is stored in memory.

The microcomputer then computes the next sample position and loads the time for it in the programmable timer 96 in accordance with the principles described above and as applied through conventional computer programming and operation techniques. The next sample is taken as above and the steps are repeated until all eight samples of each signal are taken and stored. The stored data is then taken from memory and manipulated by conventional computer techniques in the manner described above.

It is to be understood that while the detailed drawings and specific examples given describe preferred embodiments of the invention, they are for the purposes of illustration only, that the apparatus of the invention is not limited to the precise details and conditions disclosed and that various changes may be made therein without departing from the spirit of the invention which is defined by the following claims.

I claim:

1. A method for converting a plurality of time varying, periodic power distribution system signals to digital data representing said signals, said method comprising:
    (a) simultaneously sampling said time varying signals at a nominal group of spaced sampling positions and storing said samples to form constant signals;
    (b) sequentially incrementing a digital count;
    (c) generating a ramp by converting said digital count to analog form;
    (d) continuously comparing the amplitude of said ramp to the amplitude of each of said plurality of constant signals;
    (e) detecting each intersection of the ramp amplitude with a constant signal amplitude;
    (f) storing said digital count and a data signal representing the constant signal which was intersected in response to each detected intersection, wherein during each period of said ramp a plurality of counts are stored each of said counts providing a digital data byte representing the amplitude of each of said plurality of non-time-varying analog signals; and
    (g) repeating steps (a) through (f) to take a plurality of additional groups of said samples during subsequent representative, repetitive cycles but at angularly spaced positions in the composite cycle with respect to the nominal group of samples beginning at a selected angular position to form a plurality of groups of samples for a composite cycle and for each of said time varying analog samples.

2. A method in accordance with claim 1 wherein the sample positions for each of said group of samples are uniformly angularly spaced along said composite cycle.

3. A method in accordance with claim 1 wherein there is a selected set of first sample positions within an interval equal to the uniform distance between said sample positions and wherein the first sample position for each group of samples is periodically sequenced through said set of first sample positions.

4. A method in accordance with claim 1 wherein, prior to the steps of claim 1, said constant signals are generated by sequentially sampling a time varying signal at a plurality of sample positions and storing said samples to form said constant signals.

5. A method in accordance with claim 3 wherein said first sample positions are sequenced by selecting the first sample position for each group of samples to be at a position nearly one-half of the angular space between the sample positions from the first sample position of the previous group of samples until all first sample positions have been selected and then periodically repeating said sequence.

6. A method in accordance with claim 5 wherein each group of samples comprises 8 samples spaced 45° and wherein there are ten first sample positions spaced 4.5° apart and wherein said sample positions are taken in the sequence 1, 6, 2, 7, 3, 8, 4, 9, 5, 10.

7. An apparatus for converting a plurality of power distribution system signals to digital data representing said signals said apparatus being of the type including a clock, said apparatus comprising:
    (a) a digital counter having an input connected to be stepped by said clock;

(b) an isolation and signal level conversion means having an input arranged for connection to said power distribution system and for providing at its outputs a plurality of time varying analog signals which are proportional to voltage and current signals at the connection to said distribution system;

(c) a sample and hold circuit means having a plurality of inputs connected to the outputs of said isolation and signal level conversion means to receive each of said analog signals and having a control input, said sample and hold circuit means providing said constant signals at its outputs which form samples corresponding in amplitude to the amplitude of each of the analog signals applied to its inputs when its control input state is switched;

(d) a digital to analog converter having its input connected to the output of said counter to generate a ramp at its output in response to the stepping of said counter;

(e) a plurality of comparators each having an input connected to a different one of the outputs of said sample and hold circuit means to receive said constant signals and each having a second input connected to the ramp output of said digital to analog converter;

(f) logic gate intersection detection means connected to the outputs of said comparators for detecting each intersection of said ramp amplitude with a constant signal amplitude;

(g) data transfer and storage means connected to the outputs of said comparators and to the outputs of said counter for storing the count of said counter and a data byte representing which constant signal was intersected by said ramp;

(h) a microcomputer and display means including a central data processing unit connected through a data bus to receive the output data signals from said comparators and from said digital counter, memory means and a system timing circuit means;

(i) a zero cross detector means having an input connected to an output of said isolation and signal level conversion means for detecting a selected phase angle of one of said time varying analog signals; and (j) a programmable interval timer connected to said data bus for being loaded by said microcomputer with a selected time interval said interval having an input connected to the output of said zero cross detector for initiating its timing cycle in response to detection of said selected phase angle and having its output connected to said digital counter and said sample and hold means for initiating the taking and holding of a sample by said sample and hold circuit means and initiating the stepping of said digital counter.

* * * * *